US007635962B2

(12) United States Patent
Suh

(10) Patent No.: US 7,635,962 B2

(45) Date of Patent: Dec. 22, 2009

(54) MOTOR DRIVING INVERTER CIRCUIT MODULE, MOTOR DRIVING APPARATUS HAVING THE MOTOR DRIVING INVERTER CIRCUIT MODULE, AND INVERTER INTEGRATED CIRCUIT PACKAGE

(75) Inventor: Bum-seok Suh, Gyeonggi-do (KR)

(73) Assignee: Fairchild Korea Semiconductor, Ltd., Bucheon (KR)

( * ) Notice: Subject to any disclaimer, the term of this patent is extended or adjusted under 35 U.S.C. 154(b) by 109 days.

(21) Appl. No.: 11/371,409

(22) Filed: Mar. 9, 2006

(65) Prior Publication Data

US 2007/0052379 A1 Mar. 8, 2007

(30) Foreign Application Priority Data

Sep. 5, 2005 (KR) ..................... 10-2005-0082449

(51) Int. Cl.
*H02P 27/04* (2006.01)

(52) U.S. Cl. ........................ 318/801; 363/131; 257/666

(58) Field of Classification Search ................. 363/123, 363/131; 257/690, 666; 318/254, 801, 400.26
See application file for complete search history.

(56) References Cited

U.S. PATENT DOCUMENTS

| | | | | |
|---|---|---|---|---|
| 4,516,816 | A * | 5/1985 | Winthrop | 439/70 |
| 5,458,227 | A * | 10/1995 | Wheeler et al. | 198/403 |
| 5,652,467 | A * | 7/1997 | Onose et al. | 257/785 |
| 5,773,883 | A * | 6/1998 | Majumdar et al. | 257/698 |
| 5,969,966 | A * | 10/1999 | Sawa et al. | 363/163 |
| 6,337,803 | B2 * | 1/2002 | Kikuchi et al. | 363/131 |
| 6,353,258 | B1 * | 3/2002 | Inoue et al. | 257/723 |
| 6,794,742 | B2 * | 9/2004 | Kawafuji et al. | 257/690 |
| 7,236,382 | B2 * | 6/2007 | Sasaki | 363/98 |
| 7,298,027 | B2 * | 11/2007 | Yea et al. | 257/666 |

* cited by examiner

*Primary Examiner*—Bentsu Ro
*Assistant Examiner*—Antony M Paul
(74) *Attorney, Agent, or Firm*—Sidley Austin LLP

(57) ABSTRACT

The motor driving inverter circuit module includes first-phase, second-phase, and third-phase high voltage drivers generating first-phase, second-phase, and third-phase upper arm and lower arm driving signals in response to input signals for driving the first-phase, second-phase, and third-phase upper and lower arms and a first-phase, second-phase, and third-phase upper arm and lower arm transistors, generating first-phase, second-phase, and third-phase motor driving output signals in response to the first-phase, second-phase, and third-phase upper arm and lower arm driving signals of the first-phase, second-phase, and third-phase high voltage drivers. The first-phase, second-phase, and third-phase high voltage drivers and the first-phase, second-phase, and third-phase upper arm and lower arm transistors are respectively integrated into separate chips.

10 Claims, 11 Drawing Sheets

MOTOR DRIVING INVERTER CIRCUIT MODULE, MOTOR DRIVING APPARATUS HAVING THE MOTOR DRIVING INVERTER CIRCUIT MODULE, AND INVERTER INTEGRATED CIRCUIT PACKAGE

CROSS-REFERENCE TO RELATED PATENT APPLICATIONS

This application claims the benefit of Korean Patent Application No. 10-2005-0082449, filed on Sep. 5, 2005, in the Korean Intellectual Property Office, the disclosure of which is incorporated herein in its entirety by reference.

BACKGROUND OF THE INVENTION

1. Field of the Invention

The present invention relates to a motor driving circuit, and more particularly, to a motor driving inverter circuit module, a motor driving apparatus having the motor driving inverter circuit module, and a small-sized inverter integrated circuit package including three current detection terminals for detecting a three-phase output signal current of a three-phase motor.

2. Description of the Related Art

Various motor driving inverter circuits have been developed. Such a motor driving inverter circuit is a one-chip inverter circuit for driving a three-phase motor using an insulated gate bipolar transistor (IGBT) and two arm driving circuits. Circuit elements of the inverters, such as transistors and arm driving circuits, generate heat, which affects other circuit elements. This effect is often termed "thermal interaction." The one-chip inverter circuit has high thermal interaction and a narrow safe operation area (SOA) with respect to a rated power. The one-chip inverter circuit includes two terminals for detecting the output current of the three-phase motor. Some motor driving inverter circuits include 6 MOS transistors. A high voltage driver circuit can be disposed outside the inverter circuit. If no additional device is included in the inverter circuit except gate resistors, the MOS transistors will be turned on when the rate of voltage change dV/dt becomes large in the inverter circuit. The corresponding current assumes the value C dV/dt, where C is the capacitance of the MOS transistor. The inverter circuit also includes two terminals for detecting the output currents of the three-phase motor. The motor is driven by a three phase driving method, where each phase of the motor has an upper arm and a lower arm. Other motor driving inverter circuits include a high voltage driver circuit, a low voltage driver circuit, a MOS transistor group for driving an upper arm, and three MOS transistors for driving a lower arm. When the dV/dt value of this inverter circuit is large, the MOS transistor is turned on by the current CdV/dt. The inverter circuit also includes two terminals for detecting the output currents of the three-phase motor.

However, the descried conventional inverter circuits cause a "shoot-through" phenomenon of simultaneously turning on an upper arm transistor and a lower arm transistor. Furthermore, since the conventional inverter circuits include only two terminals to detect three output currents of three-phase motors, it is difficult to easily and accurately detect the output currents of the three-phase motors.

SUMMARY

In some embodiments of the present invention a motor driving inverter circuit module includes three terminals for detecting output currents of a three-phase motor, and a motor driving apparatus includes the motor driving inverter circuit module.

In some embodiments a motor driving inverter circuit module includes three high-voltage drivers and six transistors, and a motor driving apparatus includes the motor driving inverter circuit module.

In some embodiments a small-sized motor driving inverter integrated circuit package includes three current detection terminals.

In some embodiments a motor driving inverter integrated circuit package includes three high voltage drivers and six transistors.

In some embodiments, a motor driving inverter circuit module includes a first output terminal, a second output terminal, and a third output terminal for respectively providing a first-phase motor driving output signal, a second-phase motor driving output signal, and a third-phase motor driving output signal. A first high voltage driver generates a first-phase upper arm driving signal and a first-phase lower arm driving signal, in response to input signals for driving a first-phase upper arm and a first-phase lower arm. A second high voltage driver generates a second-phase upper arm driving signal and a second-phase lower arm driving signal, in response to input signals for driving a second-phase upper arm and a second-phase lower arm. A third high voltage driver generates a third-phase upper arm driving signal and a third-phase lower arm driving signal, in response to input signals for driving a third-phase upper arm and a third-phase lower arm. A pair of a first upper arm transistor and a first lower arm transistor generates the first-phase motor driving output signal, in response to the first-phase upper arm and lower arm driving signals generated by the first high voltage driver. A pair of a second upper arm transistor and a second lower arm transistor generates the second-phase motor driving output signal, in response to the second-phase upper arm and lower arm driving signals generated by the second high voltage driver. A pair of a third upper arm transistor and a third lower arm transistor generates the third-phase motor driving output signal, in response to the third upper arm and lower arm driving signals generated by the third high voltage driver. The first, second, and third high voltage drivers are respectively integrated into separate chips, and the first, second, and third upper arm and lower arm transistors are respectively integrated into separate chips.

In some embodiments the motor driving inverter circuit module further includes: a current detection terminal unit including a first current detection terminal and a second current detection terminal, wherein a current of the first-phase motor driving output signal and a current of the second-phase motor driving output signal are detected through the first current detection terminal, and a current of the third-phase motor driving output signal is detected through the second current detection terminal. The motor driving inverter circuit module further includes a current detection terminal unit having a first current detection terminal, a second current detection terminal, and a third current detection terminal, wherein currents of the first-phase, second-phase and third-phase motor driving output signals are respectively detected through the first, second, and third current detection terminals.

In some embodiments an inverter driving apparatus including a three-phase driving motor. An inverter circuit includes a first driving unit, a second driving unit, and a third driving unit for respectively applying a first-phase motor driving output signal, a second-phase motor driving output signal, and a third-phase motor driving output signal to the three-phase driving motor. The first, second, and third driving units include: high voltage drivers for generating first-phase upper arm and lower arm driving signals, second-phase upper arm and lower arm driving signals, and third-phase upper arm and lower arm driving signals, in response to input signals for driving first upper and lower arms, second upper and lower arms, and third upper and lower arms; and pairs of an upper arm transistor and a lower arm transistor which are driven by the first-phase, second-phase, and third-phase upper arm and lower arm driving signals generated by the high voltage drivers and generate the first-phase, second-phase, and third-phase motor driving output signals. A current detection unit is connected to a current detection terminal unit of the inverter circuit and detects currents of the first-phase, second-phase, and third-phase output signals provided to the three-phase driving motor. A micro computer controls the inverter circuit in response to the first-phase, second-phase, and third-phase motor driving output signals detected by the current detection unit.

In some embodiments a motor driving inverter integrated circuit package includes: a lead frame including a plurality of chip pads; a first-phase high voltage driver integrated circuit, a second-phase high voltage driver integrated circuit, and a third-phase high voltage driver integrated circuit, respectively mounted on corresponding chip pads of the plurality of the chip pads; and first-phase upper arm and lower arm transistor integrated circuits, second-phase upper arm and lower arm transistor integrated circuits, and third-phase upper arm and lower arm transistor integrated circuits, respectively mounted on corresponding chip pads of the plurality of the chip pads. A plurality of first inner leads is electrically connected to input terminals of the first-phase, second-phase, and third-phase high voltage driver integrated circuits, respectively. A plurality of second inner leads are electrically connected to input terminals and output terminals of the first-phase, second-phase, and third-phase upper arm and lower arm transistor integrated circuits, respectively. A plurality of first outer leads is connected to the first inner leads. A plurality of second outer leads is connected to the second inner leads. A plurality of first wires electrically connects the input terminals of the first-phase, second-phase, and third-phase high voltage driver integrated circuits to the plurality of the first inner leads, respectively. A plurality of second wires electrically connect the output terminals of the first-phase, second-phase, and third-phase high voltage driver integrated circuits to gates of the first-phase, second-phase, and third-phase upper arm and lower arm transistor integrated circuits, respectively. A plurality of third wires electrically connects the first-phase, second-phase, and third-phase upper arm transistor integrated circuits to the first-phase, second-phase, and third-phase lower arm transistor integrated circuits, respectively. A plurality of fourth wires electrically connect the first-phase, second-phase, and third-phase upper arm and lower arm transistor integrated circuits to the second inner leads, respectively.

In some embodiments a motor driving inverter integrated circuit package includes: a lead frame including a plurality of chip pads; a first-phase high voltage driver integrated circuit, a second-phase high voltage driver integrated circuit, and a third-phase high voltage driver integrated circuit, respectively mounted in a straight line on corresponding chip pads of the plurality of the chip pads; and first-phase upper arm and lower arm transistor integrated circuits, second-phase upper arm and lower arm transistor integrated circuits, and third-phase upper arm and lower arm transistor integrated circuits, respectively arranged in the same direction as that of the first-phase, second-phase, and third-phase high voltage driver integrated circuits, on corresponding chip pads of the plurality of the chip pads. A group of a plurality of first inner leads and a group of a plurality of second inner leads are electrically connected to the first-phase, second-phase, and third-phase high voltage driver integrated circuits and the first-phase, second-phase, and third-phase upper arm and lower arm transistor integrated circuits, respectively, wherein at least one group of the group of the first inner leads and the group of the second inner leads is disposed at a height different from that of the chip pads.

A plurality of first outer leads is connected to the first inner leads, and a plurality of second outer leads is connected to the second inner leads. A plurality of wires electrically connect the first-phase, second-phase, and third-phase high voltage driver integrated circuits to the first inner leads, electrically connect the first-phase, second-phase, and third-phase high voltage driver integrated circuits to the first-phase, second-phase, and third-phase upper arm and lower arm transistor integrated circuits, electrically connect the first-phase, second-phase, and third-phase upper arm transistor integrated circuits to the first-phase, second-phase and third-phase lower arm transistor integrated circuits, and electrically connect the first-phase, second-phase, and third-phase upper arm and lower arm transistor integrated circuits to the plurality of the second inner leads. A molding material molds the first and second inner leads, the first-phase, second-phase, and third-phase high voltage driver integrated circuits, the first-phase, second-phase, and third-phase upper and lower transistor integrated circuits, and the wires.

The at least one inner lead disposed at the height different from that of the chip pads is a first inner lead connected to the first-phase, second-phase, and third-phase high voltage driver integrated circuits. The at least one inner lead is composed of a first portion adjacent to a chip pad of the lead frame, a second portion connected to one of the first and second outer leads, and a third portion corresponding to a curved portion between the first portion and the second portion, wherein the second portion is disposed higher than the first portion and the chip pad. First chip pads on which the first-phase, second-phase, and third-phase high voltage driver integrated circuits are mounted, among the plurality of the chip pads of the lead frame, are molded to be disposed higher than second chip pads on which the first-phase, second-phase, and third-phase upper arm and lower arm transistor integrated circuits are mounted. A portion of the molding material, which molds the back surface of the second chip pad opposite to the front surface where the first-phase, second-phase, and third-phase upper arm and lower arm transistor integrated circuits are mounted on the second chip pads, has a thickness between 0.1 and 0.5 mm. The motor driving inverter integrated circuit package may be a surface mounted device (SMD) type or a dual in line package (DIP) type.

DETAILED DESCRIPTION

Figure 1:
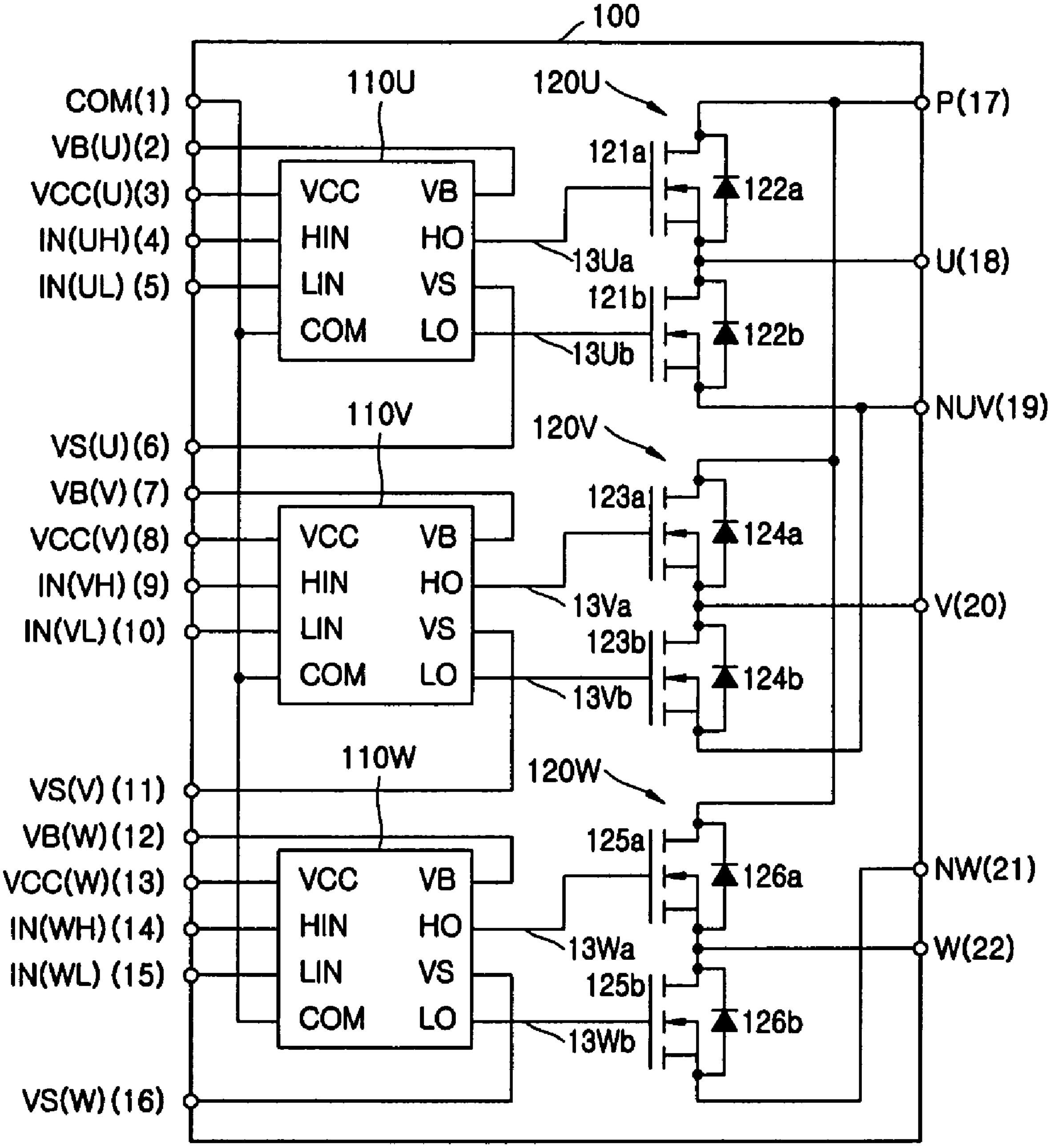
FIG. 1 is a circuit diagram of a motor driving inverter circuit module according to an embodiment of the present invention.

The present invention will now be described more fully with reference to the accompanying drawings. The invention may, however, be embodied in many different forms and should not be construed as being limited to the embodiments set forth herein. Like reference numerals in the drawings denote like elements, and thus their descriptions will not be repeated.

FIG. 1 is a circuit diagram of a motor driving inverter circuit module 100 according to an embodiment of the present invention.

Inverter circuit module 100 includes a U-phase arm driver for driving a U-phase of the motor, a V-phase arm driver for driving a V-phase of the motor, and a W-phase arm driver for driving a W-phase of the motor. The U-phase arm driver includes a first high voltage driver 110U and a first driving device 120U. The V-phase arm driver includes a second high-voltage driver 110V and a second driving device 120V. The W-phase arm driver includes a third high-voltage driver 110W and a third driving device 120W.

First high-voltage driver 110U receives U-phase arm driving input signals IN(UH) and IN(UL) through its input terminals HIN and LIN, and generates a U-phase upper arm driving signal and a U-phase lower arm driving signal through its output terminals HO and LO. First driving device 120U includes an upper arm transistor 121*a* and a lower arm transistor 121*b* connected in series between a motor driving supply voltage terminal P and a first current detection terminal NUV.

Second high-voltage driver 110V receives V-phase arm driving input signals IN(VH) and IN(VL) through its input terminals HIN and LIN, and generates a V-phase upper arm driving signal and a V-phase lower arm driving signal through its output terminals HO and LO. Second driving device 120V includes an upper arm transistor 123*a* and a lower arm transistor 123*b* connected in series between the motor driving supply voltage terminal P and first current detection terminal NUV.

Third high-voltage driver 110W receives W-phase arm driving input signals IN(WH) and IN(WL) through its input terminals HIN and LIN and generates a W-phase upper arm driving signal and a W-phase lower arm driving signal through its output terminals HO and LO. Third driving device 120W includes an upper arm transistor 125*a* and a lower arm transistor 125*b* connected in series between the motor driving supply voltage terminal P and second current detection terminal NW. In some embodiments the respective upper arm and lower arm transistors (121*a*, 121*b*), (123*a*, 123*b*), and (125*a*, 125*b*) are MOS transistors.

U-phase upper arm transistor 121*a*, whose drain is connected to motor driving supply voltage terminal P and whose gate is connected to a first output terminal HO of first high-voltage driver 110U, supplies the U-phase upper arm driving signal. U-phase lower arm transistor 121*b*, whose source is connected to first current detection terminal NUV for sensing a current of a U-phase output signal of the motor and whose gate is connected to a second output terminal LO of first high-voltage driver 110U, supplies the U-phase lower arm driving signal. The source of U-phase upper arm transistor 121*a* and the drain of U-phase lower arm transistor 121*b* are connected to a first output terminal U for providing the U-phase output signal. Diodes 122*a* and 122*b* can be respectively connected in parallel to U-phase upper arm and lower arm transistors 121*a* and 121*b*.

V-phase upper arm transistor 123*a*, whose drain is connected to motor driving supply voltage terminal P and whose gate is connected to first output terminal HO of second high-voltage driver 110 V, supplies the V-phase upper arm driving signal. V-phase lower arm transistor 123*b*, whose source is connected to first current detection terminal NUV and whose gate is connected to second output terminal LO of second high-voltage driver 110V, supplies the V-phase lower arm driving signal. The source of V-phase upper arm transistor 123*a* and the drain of U-phase lower arm transistor 123*b* are connected to a second output terminal V for providing the V-phase output signal. Diodes 124*a* and 124*b* can be respectively connected in parallel to V-phase upper arm and lower arm transistors 123*a* and 123*b*.

W-phase upper arm transistor 125*a*, whose drain is connected to motor driving supply voltage terminal P and whose gate is connected to first output terminal HO of third high-voltage driver 110W, supplies the W-phase upper arm driving signal. W-phase lower arm transistor 121*b*, whose source is connected to second current detection terminal NW for sensing a current of the W-phase output signal of the motor and whose gate is connected to second output terminal LO of third high-voltage driver 110W, supplies the W-phase lower arm driving signal. The source of W-phase upper arm transistor 125*a* and the drain of W-phase lower arm transistor 125*b* are connected to a third output terminal W for providing a W-phase output signal. Diodes 126*a* and 126*b* can be respectively connected in parallel to W-phase upper arm transistor 125*a* and W-phase lower arm transistor 125*b*.

First high-voltage driver 110U generates the U-phase upper arm driving signal and the U-phase lower arm driving signal to drive upper and lower arm transistors 121*a* and 121*b*, according to the input signals IN(UH) and IN(UL) for driving U-phase upper and lower arms. U-phase upper and lower arm transistors 121*a* and 121*b* are driven by the U-phase upper and lower arm driving signals received from first high-voltage driver 110U, and generate the U-phase output signal through first output terminal U.

Second high-voltage driver 110V generates the V-phase upper and lower arm driving signals to drive upper and lower arm transistors 123*a* and 123*b*, according to the input signals IN(VH) and IN(VL) for driving V-phase upper and lower arms. V-phase upper and lower arm transistors 123*a* and 123*b* are driven by the V-phase upper and lower arm driving signals received from second high-voltage driver 110V and generate the V-phase output signal through second output terminal V.

Third high-voltage driver 110W generates W-phase upper and lower arm driving signals for driving upper and lower arm transistors 125*a* and 125*b*, according to the input signals IN(WH) and IN(WL) for driving W-phase upper and lower arms. W-phase upper and lower arm transistors 125*a* and 125*b* are driven by the W-phase upper and lower arm driving signals received from third high-voltage driver 110W and generate a W-phase output signal through a third output terminal W.

A common ground voltage is applied to an input terminal COM of inverter circuit module 100. Bias voltages for respectively driving U-phase, V-phase and W-phase upper arm transistors 121*a*, 123*a* and 125*a* are respectively applied to input terminals VB(U), VB(V) and VB(W). Ground voltages for respectively driving U-phase, V-phase and W-phase upper arm transistors 121*a*, 123*a* and 125*a* are respectively applied to input terminals VS(U), VS(V) and VS(W). Bias voltages for respectively driving first, second and third high-voltage drivers 110U, 110V and 110W are respectively applied to input terminals Vcc(U), Vcc(V) and Vcc(W).

In some embodiments, first, second, and third high-voltage drivers 110U, 110V and 110W are respectively integrated into separate chips, and U-phase upper and lower arm transistors 121*a* and 121*b*, V-phase upper and lower arm transistors 123*a* and 123*b*, and W-phase upper and lower arm transistors 125*a* and 125*b* are also respectively integrated into separate chips. First current detection terminal NUV is a variable terminal. In embodiments, where inverter circuit module 100 includes 22 pins and two-phase output signals of three-phase output signals are detected, a U-phase output signal and a V-phase output signal of the three-phase output signals are detected through first current detection terminal NUV. In other embodiments, inverter circuit module 100 includes 23 pins and all three-phase output signals are detected. In these embodiments first current detection terminal NUV is divided into two terminals for respectively detecting a U-phase output signal and a V-phase output signal.

Figure 2:
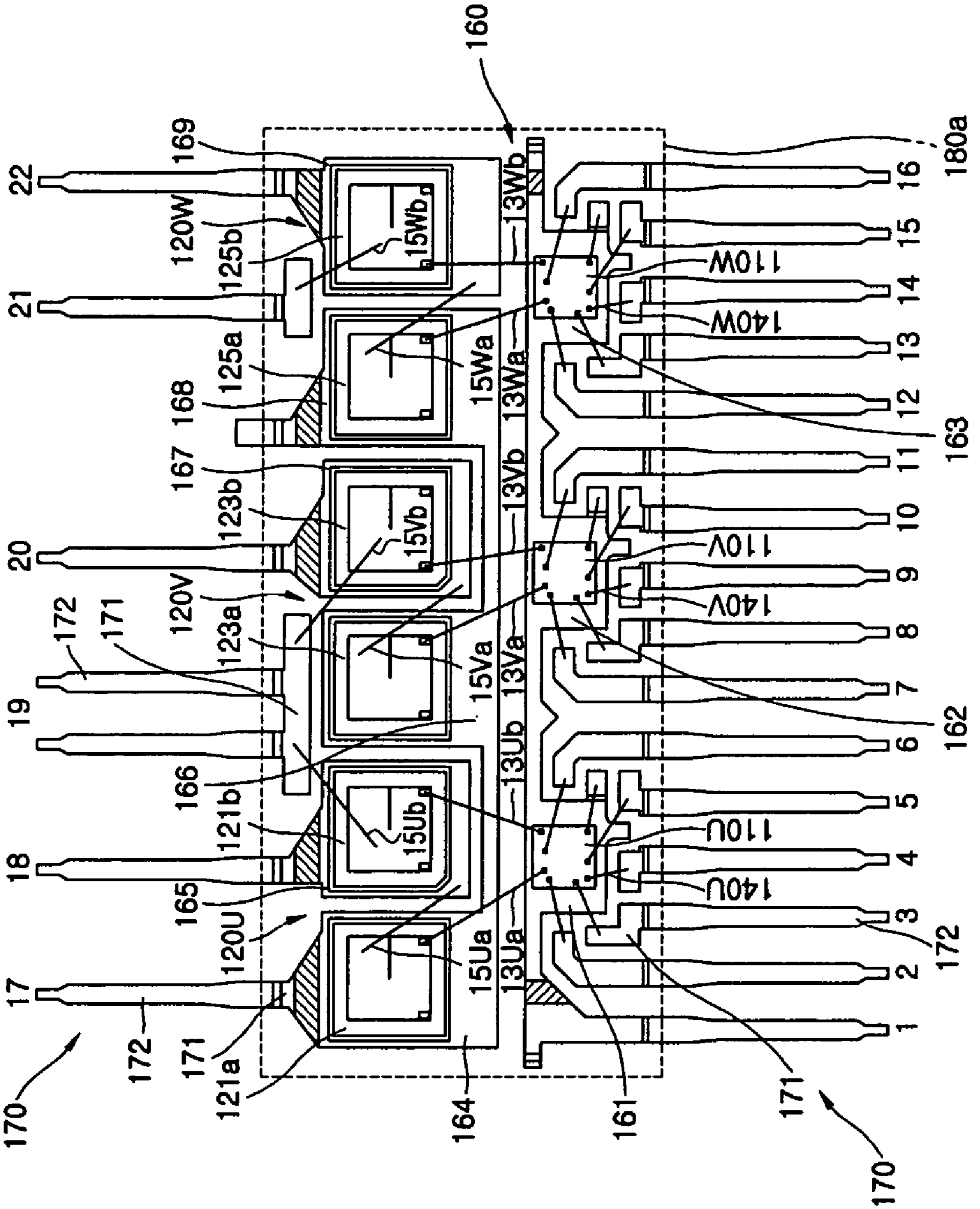
FIG. 2 is a plan of a motor driving inverter integrated circuit package according to an embodiment of the present invention.

FIG. 2 illustrates a motor driving inverter integrated circuit package after a trimming process is terminated and before an epoxy molding process according to an embodiment of the present invention. A lead frame 160 includes chip pads 161 through 169 on which integrated circuits (ICs) will be mounted. First chip pads 161, 162 and 163 are arranged in a straight line, and second chip pads 164 through 169 are also arranged in a straight line. Second chip pads 164-169 are arranged parallel to first chip pads 161-163. First, second and third high-voltage drivers 110U, 110V, and 110W are respectively mounted on first chip pads 161-163. Three-phase upper and lower arm transistors (121*a*, 121*b*), (123*a*, 123*b*) and (125*a*, 125*b*) are respectively mounted on second chip pads 164-169.

First, second and third high-voltage drivers 110U, 110V, and 110W and three-phase upper and lower arm transistors (121*a*, 121*b*), (123*a*, 123*b*) and (125*a*, 125*b*) are respectively connected to leads 170. Leads 170 include inner leads 171 connected to first, second and third high-voltage drivers 110U, 110V and 110W and three-phase upper and lower arm transistors (121*a*, 121*b*), (123*a*, 123*b*) and (125*a*, 125*b*), and outer leads 172 connected to inner leads 171.

Input terminals 2 through 16 of first, second and third high voltage drivers 110U, 110V and 110W are connected to inner leads 171 via wires 140U, 140V and 140W. The output terminals of first, second and third high voltage drivers 110U, 110V and 110W are electrically connected to three-phase upper and lower arm transistors (121*a*, 121*b*), (123*a*, 123*b*) and (125*a*, 125*b*) via wires (13Ua, 13Ub), (13Va, 13Vb) and (13Wa, 13Wb), respectively. Inner leads 171 connected to output terminals 18, 20 and 22 of three-phase upper and lower arm transistors (121*a*, 121*b*), (123*a*, 123*b*) and (125*a*, 125*b*) are extended to chip pads 165, 167 and 169 and integrated with the chip pads 165, 167 and 169. Inner leads 171 connected to current detection terminals 19 and 21 of three-phase upper and lower arm transistors (121*a*, 121*b*), (123*a*, 123*b*) and (125*a*, 125*b*) are electrically connected to lower arm transistors 121*b*, 123*b* and 125*b* via wires 15Ub, 15Vb and 15Wb. Also, three-phase upper and lower arm transistors (121*a*, 121*b*), (123*a*, 123*b*) and (125*a*, 125*b*) are electrically connected to each other via wires 15Ua, 15Va and 15Wa.

Input terminal 1 of first, second and third high voltage drivers 110U, 110V and 110W is extended to chip pad 161 and integrated with chip pad 161, thus providing a common voltage COM. A supply voltage receiving terminal 17 for providing a motor driving voltage to three-phase upper arm transistors 121*a*, 123*a* and 125*a* is extended to chip pad 164 and integrated with chip pad 164. Current detection terminal 19 acts as a common detection terminal having two leads 170 connected to each other, and detects currents of a U-phase output signal and a V-phase output signal. A portion of the motor driving inverter integrated package 180*a* (denoted by a dotted line) is molded by epoxy molding compound when an epoxy molding process is performed, except for outer leads 172. Leads 170 connected to first, second and third high voltage drivers 110U, 110V and 110W have essentially the same size and shape as outer leads 171 connected to three-phase upper arm transistors 121*a*, 123*a* and 125*a*.

FIGS. 3A through 3D illustrate an inverter integrated circuit package 100D according to an embodiment of the present invention.

Figure 3A:
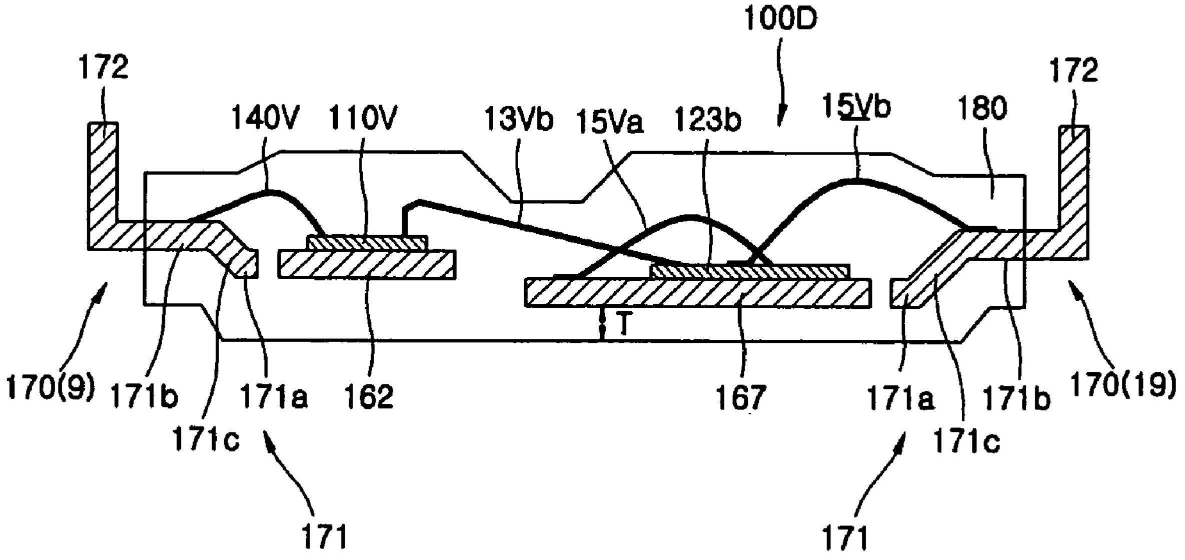
FIGS. 3A, 3B and 3C respectively illustrate a cross-sectional view, a plan, and a side view of a motor driving inverter integrated circuit package according to an embodiment of the present invention.

FIG. 3A is a cross-sectional view of inverter integrated circuit package 100D after an epoxy molding process is terminated, and shows second high voltage driver 110V and the V-phase lower arm transistor 123*b*.

Figure 3B:
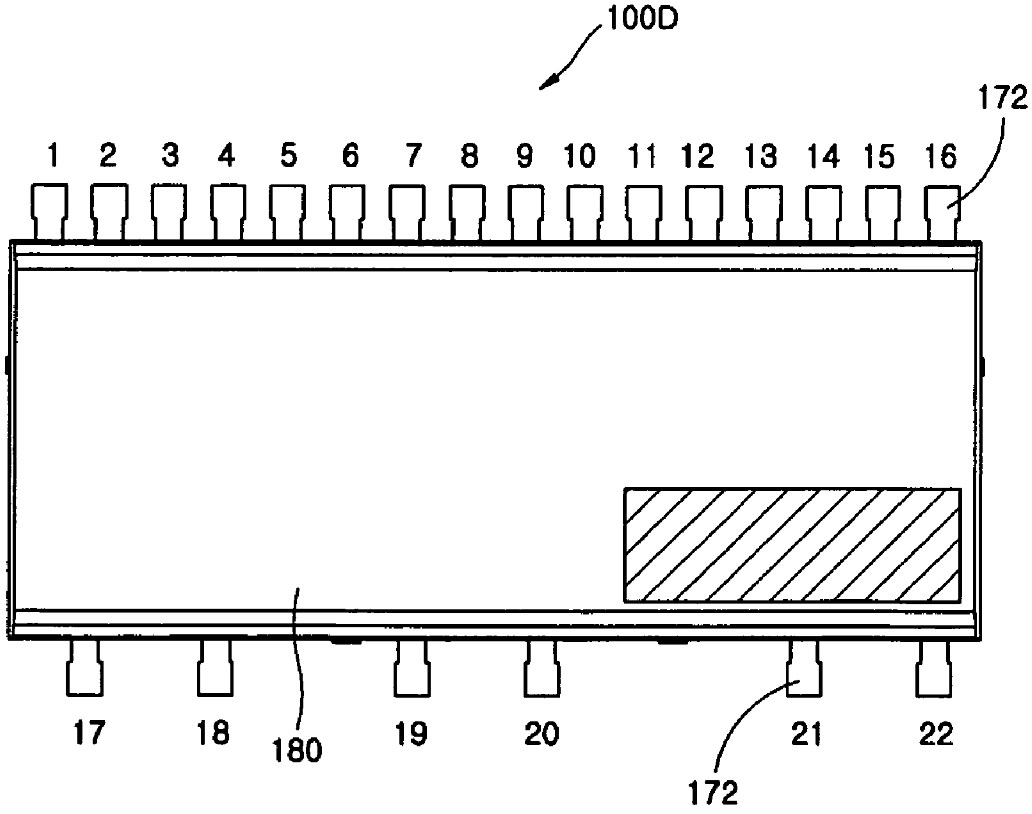
Figure 3C:
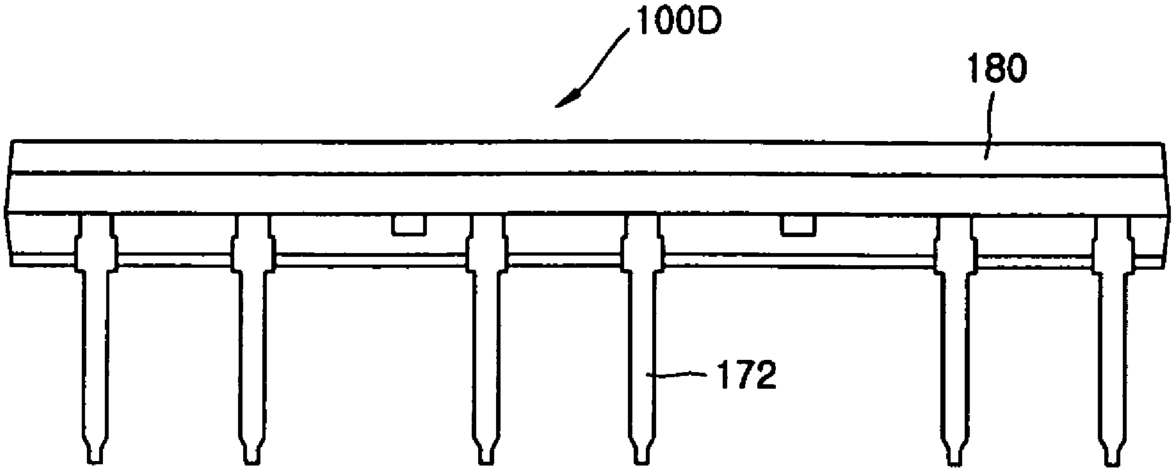

FIGS. 3B and 3C, respectively, are a plan and a side view of inverter integrated circuit package 100D.

Figure 3D:
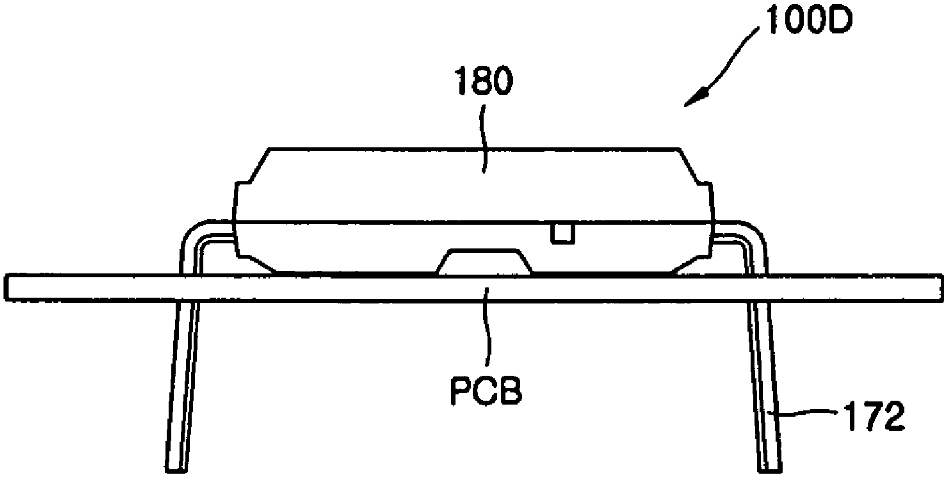
FIG. 3D shows a state where the motor driving inverter integrated circuit package is installed on a PCB substrate.

FIG. 3D shows a state where inverter integrated circuit package 100D is installed in a PCB substrate.

Referring to FIG. 2 and FIGS. 3A-D, inverter integrated circuit package 100D is a 22-pin DIP (dual in line package)-type package in which a detection terminal 19 is used as a common terminal to detect currents of U-phase and V-phase output signals. A second high voltage driver 110V is mounted on a first chip pad 162 and a V-phase lower arm transistor 123*b* is mounted on a second chip pad 167. First chip pad 162 and second chip pad 167 are molded by epoxy molding compound 180 to be disposed at different heights. First chip pad 162, a lead 170(9), second chip pad 167, and a lead 170(19) are disposed at different heights. First chip pad 162 and second chip pad 167 are positioned lower than leads 170(9) and 170(19), respectively.

Accordingly, first chip pads 161-163, on which first, second and third high voltage drivers are mounted, are molded at a location higher than second chip pads 164-169, on which three-phase upper and lower arm transistors (121*a*, 121*b*), (123*a*, 123*b*) and (125*a*, 125*b*) are mounted. Leads 170(9) and 170(19) and inner leads 171 of leads 170(9) and 170(19) have a curved shape. Inner leads 171 respectively have first portions 171*a* adjacent to chip pads 162 and 167, second portions 171*b* connected to outer leads 172, and third portions 173 connecting first portions 171*a* with second portions 171*b*. Since third portion 171*c* of each inner lead 171 has a curved shape, a height difference exists between first portion 171*a* and second portion 171*b*. As such, since inner leads 171 are curved, the thickness of inverter integrated circuit package 100D can be reduced. A portion of epoxy molding compound 180, which molds the back surface of the second chip pads opposite to the front surface where the first-phase, second-phase, and third-phase upper arm and lower arm transistor integrated circuits are mounted on the second chip pads 167, has a thickness T between 0.1 and 0.5 nm. In other embodiments, thickness T can be between 0.02 and 1 mm.

Second high voltage driver 110V mounted on first chip pad 162 is electrically connected to inner lead 171 of lead 170(9) via a wire 140V. Second high voltage driver 110V is electrically connected to V-phase lower arm transistor 123*b* mounted on second chip pad 167 via a wire 13Vb. V-phase lower arm transistor 123*b* is electrically connected to inner lead 171 of lead 170(19) via a wire 15Vb. V-phase lower arm transistor 123*b* is electrically connected to V-phase upper arm transistor 123*a* (see FIG. 2) via a wire 15Va. Outer leads 172 of leads 170(9) and 170(19) are arranged in a straight line, and inverter integrated circuit package 100D is mounted on a printed circuit board (PCB) as illustrated in FIG. 3D.

FIGS. 4A through 4D illustrate an inverter integrated circuit package 100S according to another embodiment of the present invention.

Figure 4A:
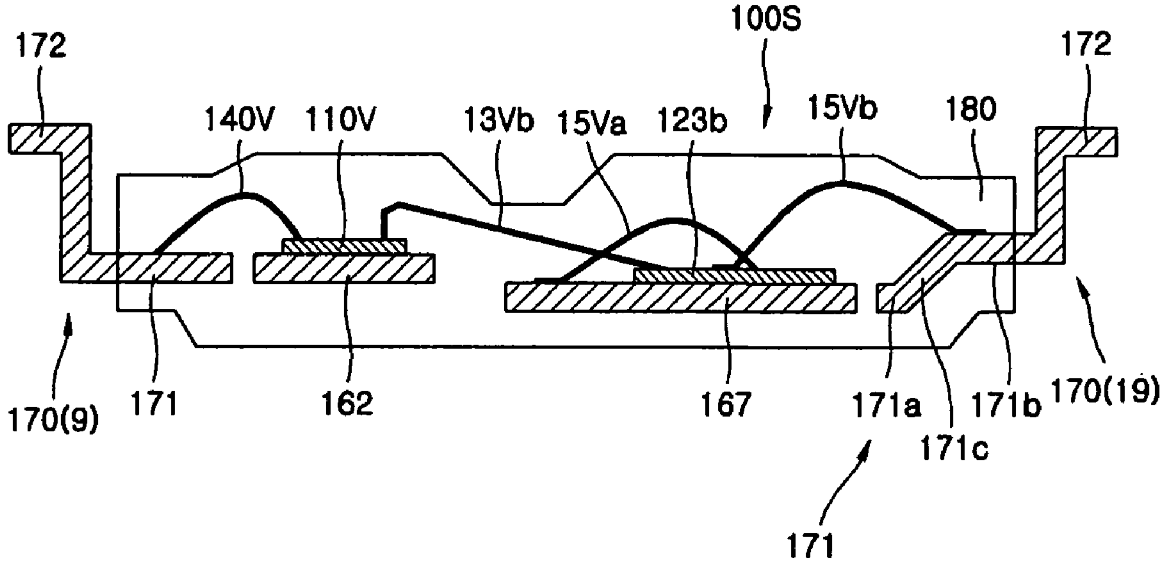
FIGS. 4A, 4B and 4C respectively illustrate a cross-sectional view, a plan, and a side view of a motor driving inverter integrated circuit package according to another embodiment of the present invention.

FIG. 4A is a cross-sectional view of the inverter integrated circuit package 100S after an epoxy molding process is terminated, and shows a second high voltage driver 110V and a V-phase lower arm transistor 123*b*.

Figure 4B:
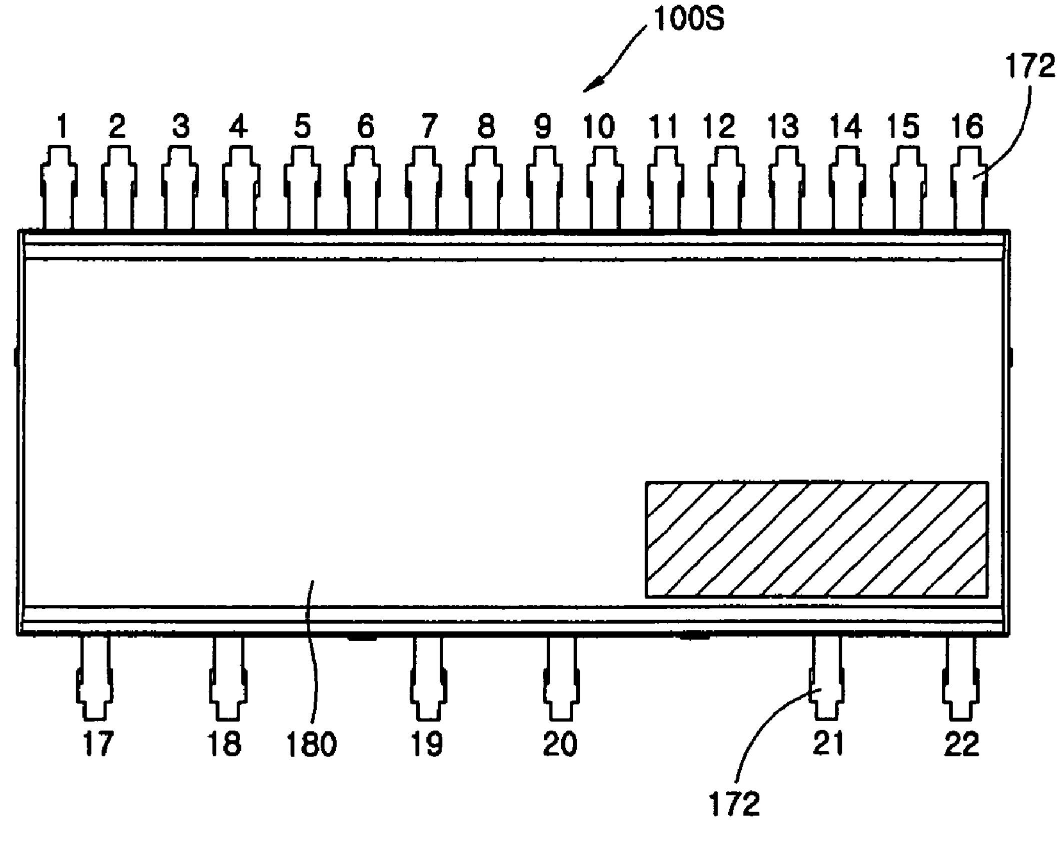
Figure 4C:
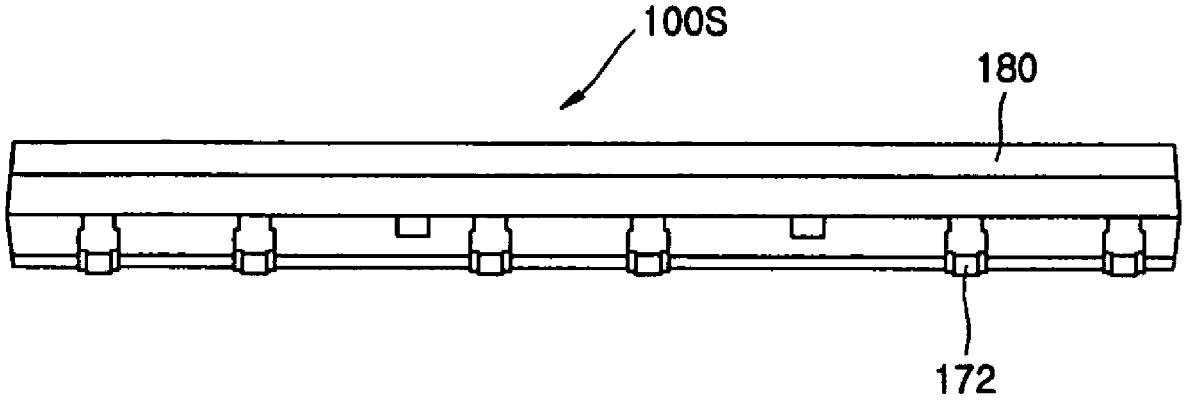
Figure 4D:
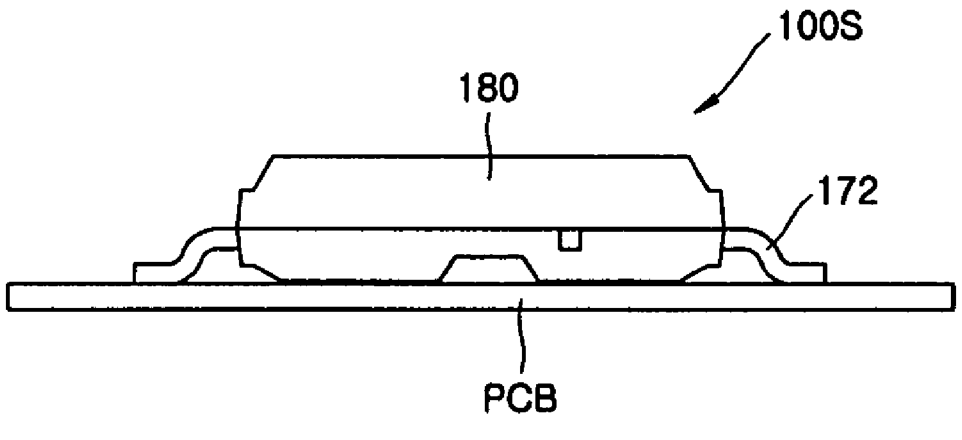
FIG. 4D shows a state where the motor driving inverter integrated circuit package is installed in a PCB substrate.

FIGS. 4B and 4C are a plan and a side view of the inverter integrated circuit package 100S, and FIG. 4D shows a state where the inverter integrated circuit package 100S is installed on a PCB substrate. Referring to FIGS. 4A through 4D, the inverter integrated circuit package 100S is a 22-pin surface mounted device (SMD) type package in which detection terminal 19 is used as a common terminal to detect currents of U-phase and V-phase output signals. Second high voltage driver 110V is mounted on first chip pad 162, and V-phase lower arm transistor 123*b* is mounted on second chip pad 167. A height difference exists between first chip pad 162 and second chip pad 167. First chip pad 162 and second chip pad 167 are molded with epoxy molding compound 180. A height difference exists between second chip pad 165 and a lead 170(19). Second chip pad 167 is disposed lower than lead 170(19).

Accordingly, first chip pads 162 on which first, second and third high voltage driver integrated circuits are mounted, among the plurality of chip pads illustrated in FIG. 2, are molded to be disposed higher than second chip pads 164-169 on which three-phase upper and lower arm transistors (121*a*, 121*b*), (123*a*, 123*b*), and (125*a*, 125*b*) are mounted. Leads of three-phase upper and lower arm transistors (121*a*, 121*b*), (123*a*, 123*b*), and (125*a*, 125*b*) mounted on second chip pads 164-169 have a curved shape. For example, a lead 170(9) has a curved shape, and inner lead 171 of lead 170(9) may have a curved shape. Inner lead 171 has a first portion 171*a* adjacent to chip pad 167, a second portion 171*b* connected to an outer lead 172, and a third portion 171*c* connecting first portion 171*a* with second portion 171*b*. Since third portion 171*c* of inner lead 171 is curved, a height difference exists between first portion 171*a* and second portion 171*b*. Accordingly, the thickness of inverter integrated circuit package 100S can be reduced. A portion of epoxy molding compound 180, which molds the back surface opposite to the front surface where the first-phase, second-phase, and third-phase upper arm and lower arm transistor integrated circuits are mounted on second chip pads 165, has a thickness T between 0.1 and 0.5 mm. In other embodiments, thickness T can be between 0.02 and 1 mm.

Second high voltage driver 110V mounted on first chip pad 161 is electrically connected to inner lead 171 of lead 170(9) via a wire 140V. Second high voltage driver 110V is electrically connected to V-phase lower arm transistor 123*b* mounted on second chip pad 165 via a wire 13Vb. V-phase lower arm transistor 123*b* is electrically connected to inner lead 171 of lead 170(19) via a wire 15Vb. V-phase lower arm transistor 123*b* is also electrically connected to a V-shape upper arm transistor 123*a* (see FIG. 2) via a wire 15Va. Outer leads 172 of leads 170 have a "Z" shape, and inverter integrated circuit package 100S is mounted on a PCB as illustrated in FIG. 4D.

Figure 5:
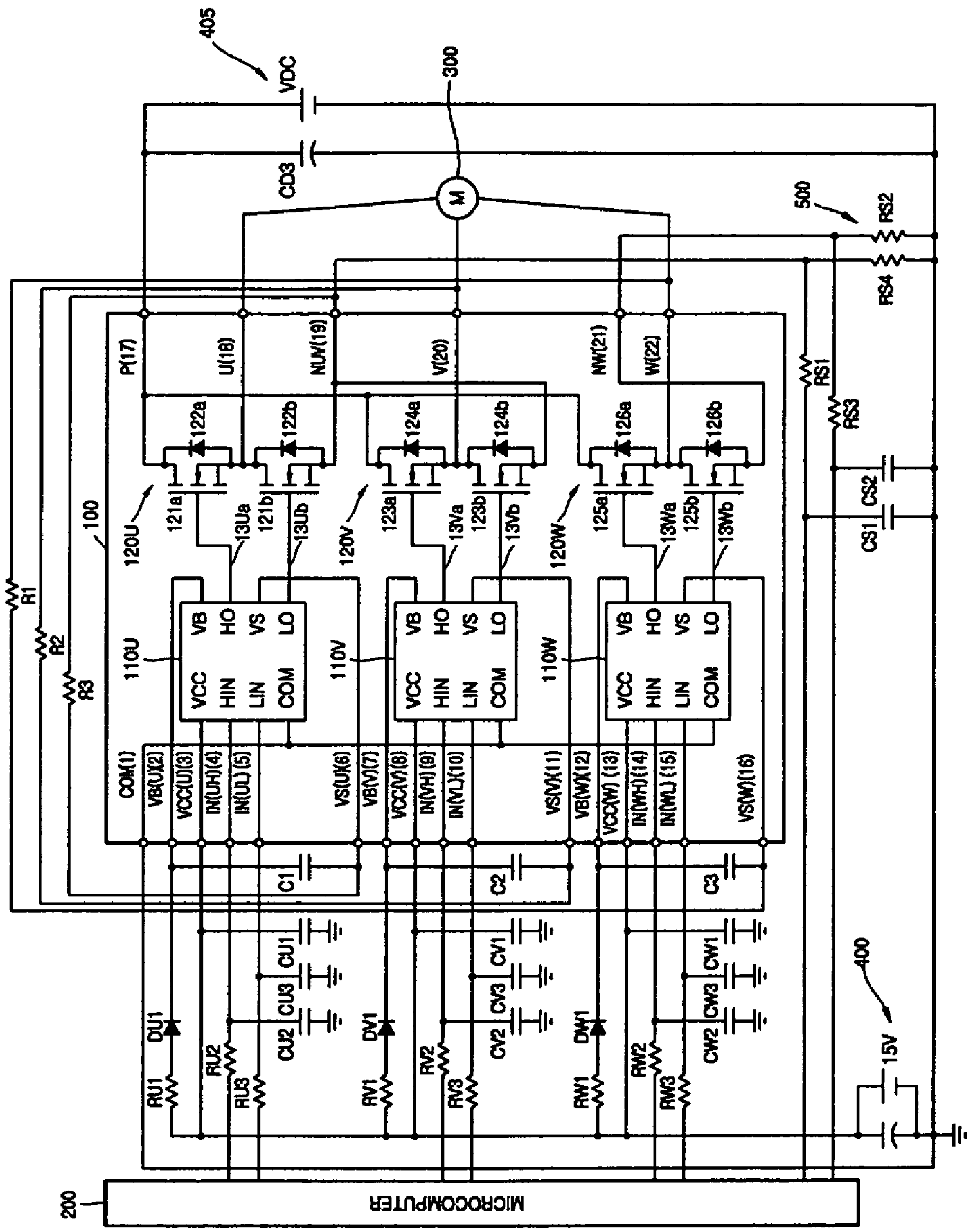
FIG. 5 is a circuit diagram of a motor driving apparatus according to an embodiment of the present invention.

FIG. 5 is a circuit diagram of a motor driving apparatus according to an embodiment of the present invention. The motor driving apparatus includes an inverter circuit 100, a micro computer 200, power supply units 400 and 405, and a current detection unit 500. Inverter circuit 100 can be, for example, the circuit illustrated in FIG. 1. Inverter circuit 100 includes first, second and third drivers for respectively providing a U-phase output signal U, a V-phase output signal V, and a W-phase output signal W to a motor 300. First, second and third drivers respectively include high voltage drivers 110U, 110V and 110W, and transistor pairs (121*a*, 121*b*), (123*a*, 123*b*) and (125*a*, 125*b*). High voltage drivers 110U, 110V and 110W respectively generate U-phase, V-phase and W-phase upper and lower arm driving signals, according to input signals (IN(UH), IN(UL)), (IN(VH), IN(VL)), and (IN (WH), IN(WL)) for driving U-phase, V-phase and W-phase upper and lower arms. Transistor pairs (121*a*, 121*b*), (123*a*, 123*b*), and (125*a*, 125*b*) are respectively driven in response to the U-phase, V-phase, and W-phase upper and lower arm driving signals generated by high voltage drivers 110U, 110V and 110W, and respectively generate U-phase, V-phase and W-phase output signals for driving a motor 300.

A motor driving supply voltage VDC from power supply unit 405 is applied to the drain of U-phase upper arm transistor 121*a* through a supply voltage receiving terminal P. The gate of U-phase upper arm transistor 121*a* is connected to a first output terminal HO of first high voltage driver 110U, and the U-phase upper arm driving signal is applied to the gate of U-phase upper arm transistor 121*a*. The source of U-phase lower arm transistor 121*b* is connected to current detection unit 500 through a first current detection terminal NUV. The gate of the U-phase lower arm transistor 121*b* is connected to a second output terminal LO of first high voltage driver 110U, and the U-phase lower arm driving signal is applied to gate of the U-phase lower arm transistor 121*b*. The source of U-phase upper arm transistor 121*a* is connected to the drain of U-phase lower arm transistor 121*b* so that a U-phase output signal can be provided to motor 300 through an output terminal U.

A motor driving supply voltage VDC from power supply unit 405 is applied to the drain of V-phase upper arm transistor 123*a* through a motor driving supply voltage terminal P. The gate of V-phase upper arm transistor 123*a* is connected to a first output terminal HO of second high voltage driver 110V, and the V-phase upper arm driving signal is applied to the gate of V-phase upper arm transistor 123*a*. The source of V-phase lower arm transistor 123*b* is connected to current detection unit 500 through first current detection terminal NUV. The gate of V-phase lower arm transistor 123*b* is connected to a second output terminal LO of second high voltage driver 110V, and the V-phase lower arm driving signal is applied to the gate of V-phase lower arm transistor 123*b*. The source of V-phase upper arm transistor 123*a* is connected to the drain of V-phase lower arm transistor 123*b* so that a V-phase output signal can be applied to motor 300 through output terminal V.

The motor driving supply voltage VDC from power supply unit 405 is applied to the drain of W-phase upper arm transistor 125*a* through motor driving supply voltage terminal P. The gate of W-phase upper arm transistor 125*a* is connected to a first output terminal HO of third high voltage driver 110W, and the W-phase upper arm driving signal is applied to the gate of W-phase upper arm transistor 125_a_. The source of W-phase lower arm transistor 125_b_ is connected to current detection unit 500 through a second current detection terminal NW. The gate of W-phase lower arm transistor 125_b_ is connected to a second output terminal LO of third high voltage driver 110W, and the W-phase lower arm driving signal is applied to the gate of W-phase lower arm transistor 125_b_. The source of W-phase upper arm transistor 125_a_ is connected to the drain of W-phase lower arm transistor 125_b_ so that a W-phase output signal is applied to motor 300 through an output terminal W.

Power supply unit 400 provides a supply voltage of 15 V generally required for driving high voltage drivers 110U, 110V, and 110W. In other embodiments, the supply voltage can be in a range of 5V to 30V. Power supply unit 405 provides the motor driving supply voltage VDC for driving motor 300. Current detection unit 500 detects currents of the U-phase, V-phase, and W-phase output signals. Resistors RS1 and RS2 and a capacitor CS1 are connected to first detection terminal NUV where the currents of the U-phase and V-phase output signals are detected. Resistors RS3 and RS4 and a capacitor CS2 are connected to second detection terminal NW and a current of the W-phase output signal is detected. A signal detected by current detection unit 500 is provided to micro computer 200. Micro computer 200 controls the driving of motor 300 in response to a current detection signal generated by current detection unit 500.

Resistor-capacitor pairs (RU2, CU2), (RU3, CU3), (RV2, CV2), (RV3, CV3), (RW2 CW2), and (RW3, CW3) provide the input signals (IN(UH), IN(UL)), (IN(VH), IN(VL)), and (IN(WH), IN(WL)) from micro computer 200 to high voltage drivers 110U, 110V and 110W, thus preventing an improper input signal from being supplied due to surge noise. Capacitors C1, C2, C3, CU1, CV1, CW1, and CDC, which are bypass capacitors, capable of absorbing a high frequency ripple current. (Bootstrap) capacitors C1, C2 and C3, (bootstrap) resistors RU1, RV1, RW1, R1, R2 and R3, and (bootstrap) diodes DU1, DV1 and DW1 are used to generate bias voltages for driving the upper arm transistors. The time constants of the respective devices are selected according to the characteristics of a motor driving pulse width modulation (PWM) signal.

FIG. 5 illustrates an embodiment, where two current detection terminals are connected to two shunt resistors to detect currents of three-phase output signals. In other embodiments, current detection terminals are connected to detect currents of three-phase output signals through shunt resistors.

Figure 6:
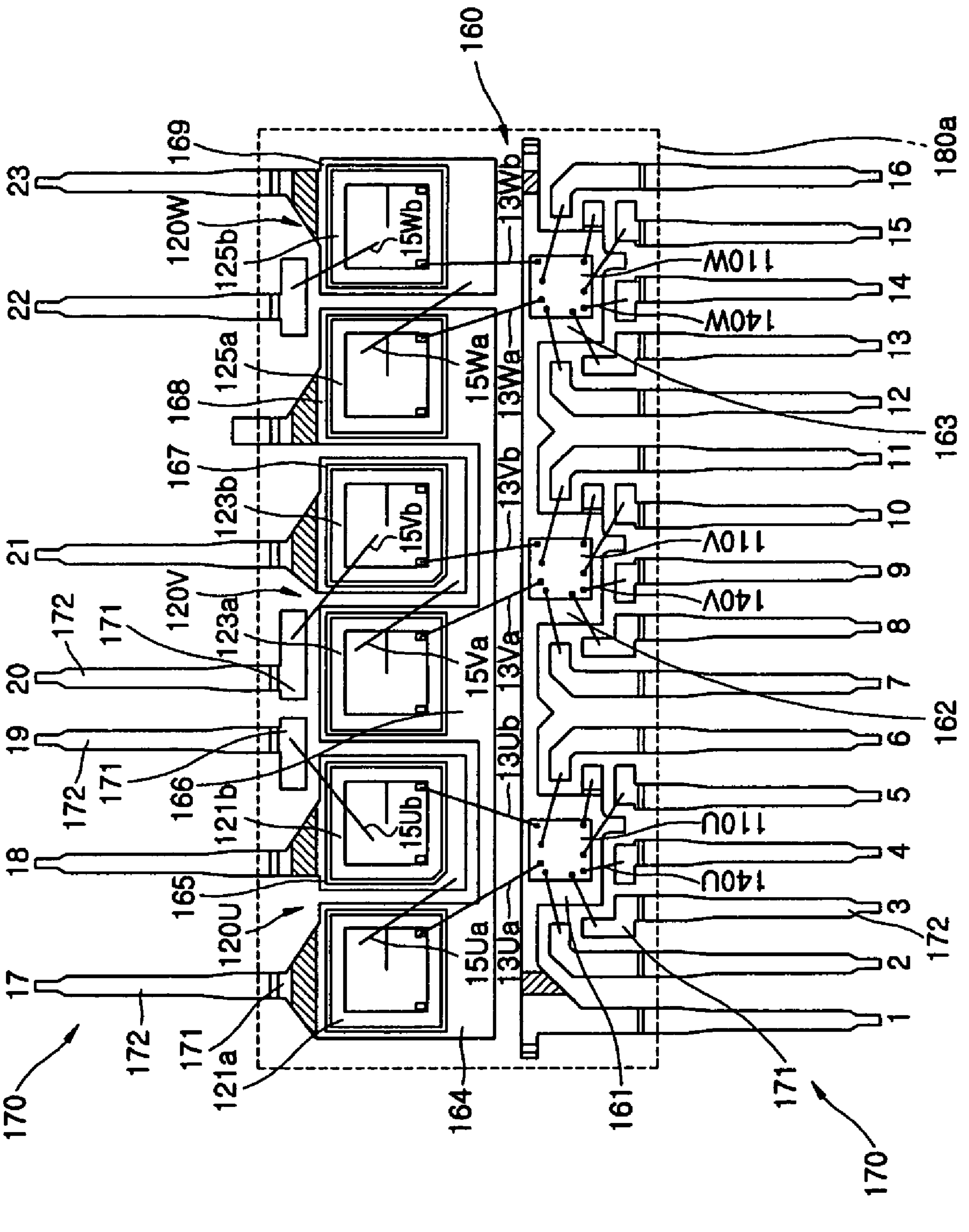
FIG. 6 is a plan of a motor driving inverter integrated circuit package according to another embodiment of the present invention.

FIG. 6 illustrates a motor driving inverter integrated circuit package after a trimming process is terminated and before an epoxy molding process according to another embodiment of the present invention. The inverter integrated circuit package illustrated in FIG. 6 has the same configuration as the inverter integrated circuit package illustrated in FIG. 2, except that a detection terminal, a first detection terminal 19 for detecting a U-phase output signal, is separated from a current detection terminal, a second detection terminal 20 for detecting a V-phase output detection signal.

Hereinafter, first and second detection terminals 19 and 20 will be described. Referring to FIG. 6, three-phase upper and lower arm transistors (121_a_, 121_b_), (123_a_, 123_b_), and (125_a_, 125_b_) are respectively mounted on second chip pads 164-169. First detection terminal 19 is electrically connected to U-phase lower arm transistor 121_b_ via wire 15Ub, and second detection terminal 20 is electrically connected to V-phase lower arm transistor 123_b_ via wire 15Vb. A third detection terminal 22 is electrically connected to W-phase lower arm transistor 125_b_ via wire 15Wb. The U-phase output signal generated by U-phase upper and lower arm transistors 121 a and 121_b_ is provided to motor 300 through an output terminal 18. The V-phase output signal generated by the V-phase upper and lower arm transistors 123_a_ and 123_b_ is provided to motor 300 through an output terminal 21. The W-phase output signal generated by W-phase upper and lower arm transistors 125_a_ and 125_b_ is provided to motor 300 through an output terminal 23.

If the inverter integrated circuit package illustrated in FIG. 6 is molded with epoxy molding compound during a molding process, the DIP-type package illustrated in FIGS. 3A through 3D or the SMD-type package illustrated in FIGS. 4A through 4D, as described in the above embodiments, can be manufactured. In the current embodiment of the present invention, since a terminal for detecting a current of a U-phase output signal is separated from a terminal for detecting a current of a V-phase output signal, three detection terminals are provided to detect three-phase output signals. Therefore, the inverter integrated circuit package can be manufactured as a 23-pin DIP package or a 23-pin SMD package.

Figure 7:
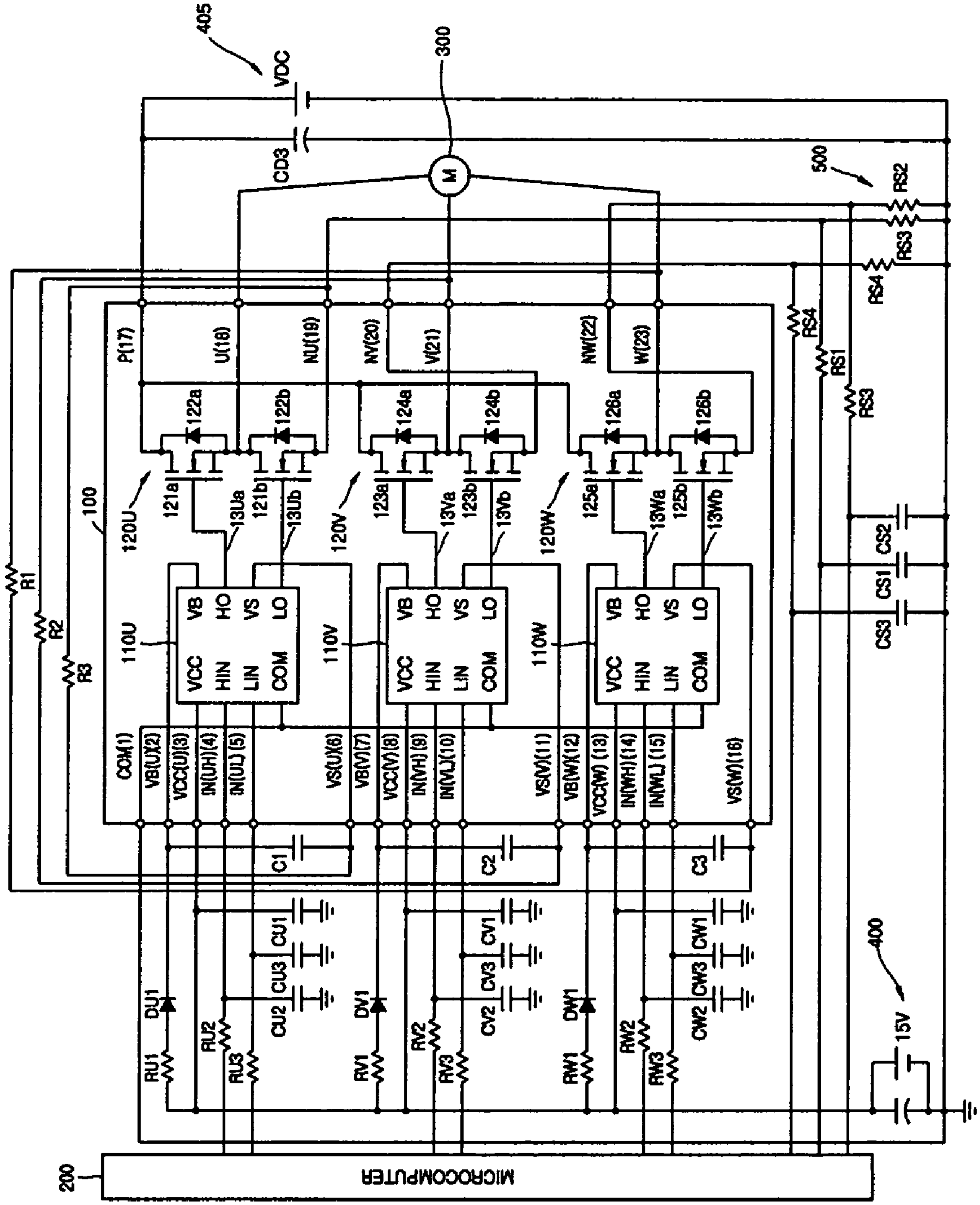
FIG. 7 is a circuit diagram of a motor driving apparatus according to another embodiment of the present invention.

FIG. 7 is a circuit diagram of a motor driving apparatus according to an embodiment of the present invention. The motor driving apparatus illustrated in FIG. 7 is different from the circuit configuration illustrated in FIG. 5 in that an inverter circuit includes three detection terminals for detecting currents of three-phase output signals. Therefore, the current detection terminals will now be described in more detail. Referring to FIG. 7, the motor driving apparatus includes inverter circuit unit 100, micro computer 200, power supply units 400 and 405, and current detection unit 500. Inverter circuit unit 100 has the same configuration as that illustrated in FIG. 1, except that first current detection terminal NUV of FIG. 1 is substituted by U-phase and V-phase current detection terminals. Inverter circuit unit 100 includes first, second and third drivers for respectively providing U-phase, V-phase, and W-phase output signals U, V and W to motor 300. First, second and third drivers respectively include high voltage drivers 110U, 110V and 110W and transistor pairs (121_a_, 121_b_), (123_a_, 123_b_) and (125_a_, 125_b_).

The motor driving supply voltage VDC from power supply unit 405 is applied to the drain of U-phase upper arm transistor 121_a_ through motor driving supply voltage terminal P. The gate of U-phase upper arm transistor 121_a_ is connected to first output terminal HO of first high voltage driver 110U and the U-phase upper arm driving signal is applied to the gate of U-phase upper arm transistor 121_a_. The source of U-phase lower arm transistor 121_b_ is connected to current detection unit 500 through a first current detection terminal NU. The gate of the U-phase lower arm transistor 121_b_ is connected to second output terminal LO of first high voltage driver 110U and the U-phase lower arm driving signal is applied to the gate of U-phase lower arm transistor 121_b_. The source of U-phase upper arm transistor 121_a_ is connected to the drain of U-phase lower arm transistor 121_b_ so that the U-phase output signal is applied to motor 300 through output terminal U.

The motor driving supply voltage VDC from power supply unit 405 is applied to the drain of V-phase upper arm transistor 123_a_ through motor driving supply voltage terminal P. The gate of V-phase upper arm transistor 123_a_ is connected to first output terminal HO of second high voltage driver 110V, and the V-phase upper arm driving signal is applied to the gate of V-phase upper arm transistor 123_a_. The source of V-phase lower arm transistor 123_b_ is connected to current detection unit 500 through a second current detection terminal NV. The gate of V-phase lower arm transistor 123_b_ is connected to second output terminal LO of second high voltage driver 110V, and the V-phase lower arm driving signal is applied to the gate of V-phase lower arm transistor 123*b*. The source of V-phase upper arm transistor 123*a* is connected to the drain of V-phase lower arm transistor 123*b* so that the V-phase output signal is applied to motor 300 through output terminal V.

The motor driving supply voltage VDC from power supply unit 405 is applied to the drain of W-phase upper arm transistor 125*a* through motor driving supply voltage terminal P. The gate of W-phase upper arm transistor 125*a* is connected to first output terminal HO of third high voltage driver 110W, and the W-phase upper arm driving signal is applied to the gate of W-phase upper arm transistor 125*a*. The source of W-phase lower arm transistor 125*b* is connected to current detection unit 500 through a third current detection terminal NW. The gate of W-phase lower arm transistor 125*b* is connected to second output terminal LO of third high voltage driver 110W, and the W-phase lower arm driving signal is applied to the gate of W-phase lower arm transistor 125*b*. The source of W-phase upper arm transistor 125*a* is connected to the drain of W-phase lower arm transistor 125*b* so that the W-phase output signal is applied to motor 300 through output terminal W.

Figure 8:
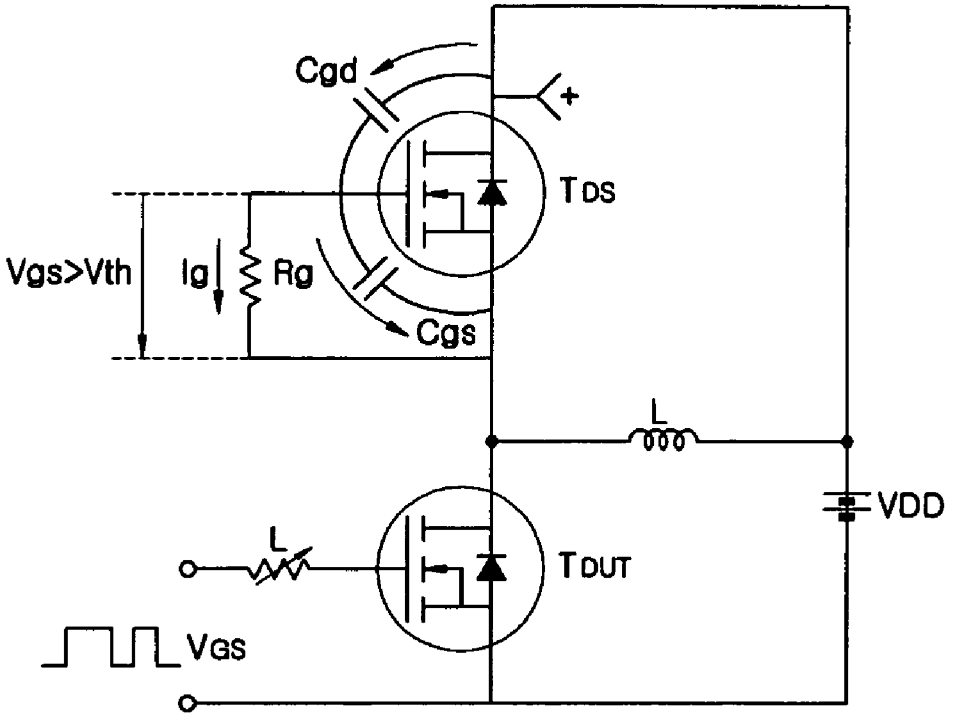
FIG. 8 is a view for explaining an operation of the motor driving inverter circuit module of FIG. 1.

FIG. 8 illustrates the operation of the motor driving inverter circuit module according to an embodiment of the present invention. According to the current embodiment, the upper and lower arm transistors are MOS transistors. Upper MOS transistor TDS and a lower MOS transistor TDUT can be the same. In such embodiments, gate resistance for switching upper MOS transistor TDS is equal to a gate resistance for switching lower MOS transistor TDUT. The gate turn-on resistance for turning on MOS transistors TDS and TDUT is denoted by $R_{g(on)}$, and the gate turn-off resistance for turning off MOS transistors TDS and TDUT is denoted by $R_{g(off)}$.

If the gate resistance $R_{g(off)}$ is sufficiently small, a gate voltage $V_{gs}$ of upper MOS transistor TDS can be expressed by the following Equation (1), while the lower MOS transistor TDUT is turned on:

$$V_{gs} \cong R_{g(off)} i_{gd} = R_{g(off)} C_{gd} dV_{ds}/dt|_{on} \quad (1)$$

Here $dV_{ds}/dt|_{on}$ is proportional to the gate turn-on resistance $R_{g(on)}$.

On the other hand, if the gate turn-off resistor $R_{g(off)}$ is sufficiently large, the gate voltage $V_{gs}$ of upper MOS transistor TDS can be expressed as:

$$V_{gs} \cong [C_{gd}/(C_{gs}+C_{gd})]V_{ds} \cong [C_{gd}/C_{gs}]V_{ds} \quad (2)$$

Here, $C_{gs}$ is a parasitic capacitance between the gate and the source of upper MOS transistor TDS, and $C_{gd}$ is a parasitic capacitance between the gate and the drain of upper MOS transistor TDS, and $V_{ds}$ is a voltage between the drain and the source of upper transistor TDS.

If voltage $V_{ds}$ is higher than about 25 V, the parasitic capacitance $C_{gd}$ is significantly smaller than the parasitic capacitance $C_{gs}$ and $dV_{ds}/dt$ is proportional to the turn-on resistance $R_{g(on)}$. If the gate voltage $V_{gs}$ of upper MOS transistor TDS is higher than a threshold voltage $V_{th}$, upper MOS transistor TDS turns on while lower MOS transistor TDUT is also turned on. This is sometimes referred to as the shoot-through phenomenon: the simultaneous turning on of both upper and lower transistors TDS and TDUT. The shoot-through phenomenon can occur in respective U-phase, V-phase, and W-phase transistors (121*a*, 121*b*), (123*a*, 123*b*), and (125*a*, 125*b*) of the inverter circuit module, so that a part or all of the U-phase, V-phase, and W-phase transistors (121*a*, 121*b*), (123*a*, 123*b*), and (125*a*, 125*b*) are simultaneously turned on. The shoot-through phenomenon can increase the loss of the inverter circuit module or even destroy the inverter circuit module. The shoot-through phenomenon can be removed by reducing the gate turn-off resistance $R_{g(off)}$, as shown in Equation (1). However, reducing gate turn-off resistance $R_{g(off)}$ increases the electromagnetic interference (EMI). And conversely, increasing gate turn-off resistance $R_{g(off)}$ to reduce EMI can cause the shoot-through phenomenon if the MOS transistors do not satisfy Equation (2).

In some embodiments, the shoot-through phenomenon according to the Equations (1) and (2) is prevented by a method of optimizing the gate oxide films Gox of the U-phase, V-phase and W-phase upper arm transistors 121*a*, 123*a*.

The gate oxide films $G_{ox}$ of the upper arm MOS transistors 121*a*, 123*a* and 125*a* are optimized by selecting the $C_{gs}/C_{gd}$ ratio and the threshold voltage $V_{th}$ of the upper arm MOS transistors 121*a*, 123*a* and 125*a* to satisfy the relation:

$$R_{g(off)} C_{gs}/C_{gd} > 0.8\, BV_{ds}/V_{th(min)}.$$

Here, $BV_{ds}$ is a break-down voltage between the drain and source of each upper arm MOS transistor when the gate of the upper arm MOS transistor is shorted, and $V_{th(min)}$ is a minimal value of the threshold voltage distribution of the upper arm MOS transistor. In some embodiments the numerical constant 0.8 can assume values between 0.7 and 0.9. This distribution maybe the result of process deviations. Accordingly, the thickness of the gate oxide film Gox is adjusted so that the capacitance ratio $C_{gs}/C_{gd}$ takes a suitable value. Characteristic charges of the capacitors can be defined as $Q_{gd}=C_{gd} \times V_{gd}$ and $Q_{gs}=C_{gs} \times V_{gs}$. With these definitions a suitable charge ratio $Q_{gd}/Q_{gs}$ is less than 2. Here, $Q_{gd}$ is a charge between the gate and drain of each of upper arm MOS transistors 121*a*, 123*a*, and 125*a*, and $Q_{gs}$ is a charge between the gate and source of each of upper arm MOS transistors 121*a*, 123*a*, and 125*a*.

Figure 9:
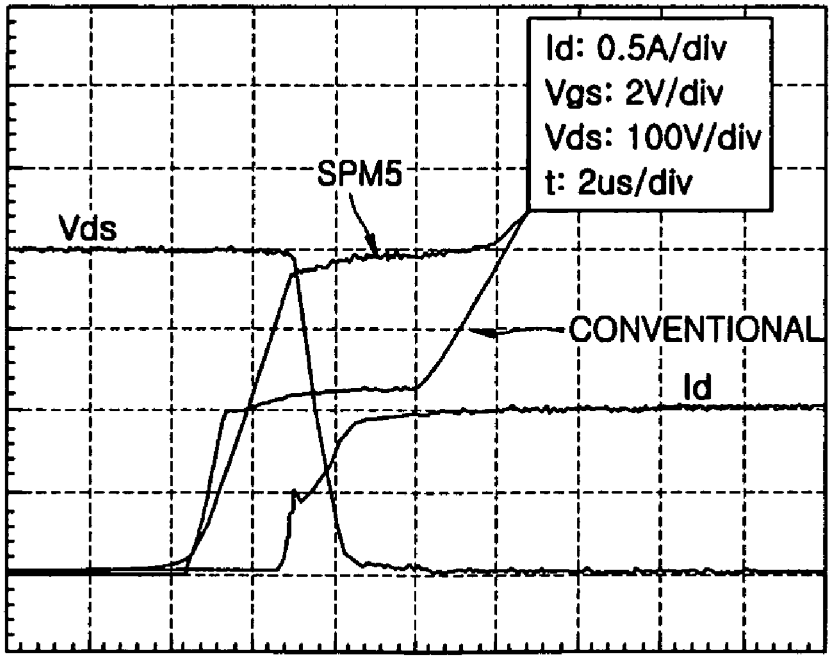
FIG. 9 is a characteristic graph of the motor driving inverter circuit module of FIG. 1.

FIG. 9 is a waveform plotting an immunity characteristic with respect to dV/dt of the inverter circuit module of FIG. 1. The horizontal axis indicates time. The "SPM5" and "conventional" waveforms indicate the voltage $V_{gs}$. These waveforms indicate that the immunity characteristic with respect to the EMI noise of the present inverter circuit is improved compared to conventional inverters.

Figure 10A:
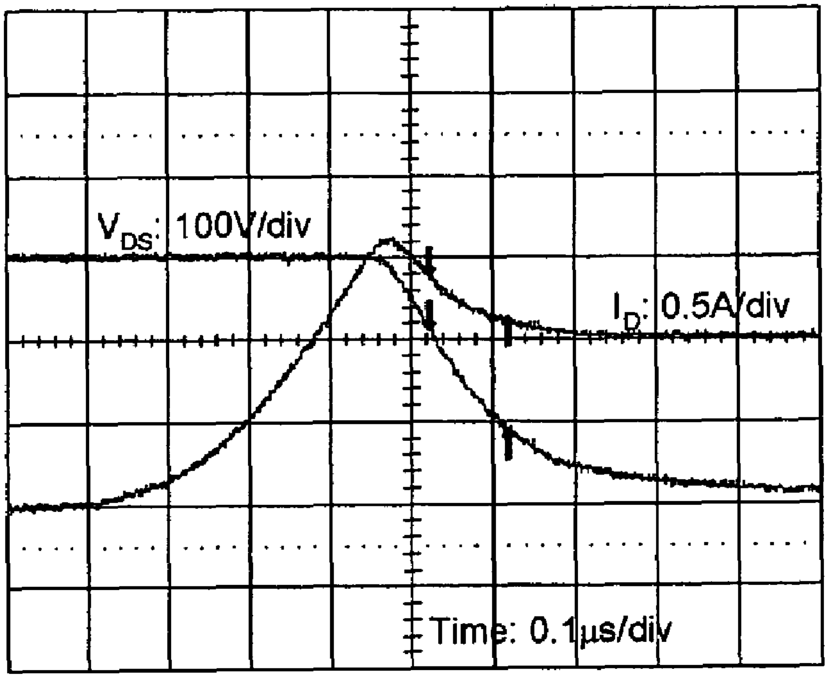
FIGS. 10A and 10B are characteristic graphs of the motor driving inverter circuit module of FIG. 1.
Figure 10B:
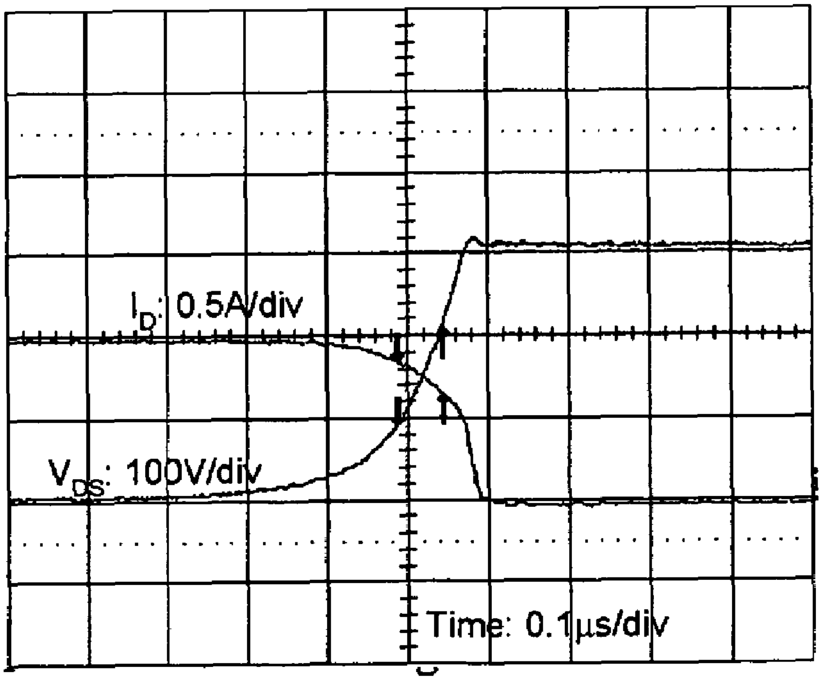

FIGS. 10A and 10B are waveforms plotting dV/dt with respect to EMI of the inverter circuit module of FIG. 1.

FIG. 10A illustrates the signals when each upper arm MOS transistor is turned on.

FIG. 10B illustrates the signals when each upper arm MOS transistor is turned off.

As illustrated in FIGS. 9 and 10A-b, the inverter circuit module according to embodiments of the present invention optimizes the charge ratio $Q_{gd}/Q_{gs}$ and the threshold voltage value $V_{th}$ to optimize the thickness of the gate oxide film Gox, thereby improving the EMI characteristic without causing the shoot-through phenomenon with respect to dV/dt.

In FIGS. 10A and 10B, VDS is the voltage applied between the source and drain of the MOS transistor and $I_D$ is current flowing through the MOS transistor. The EMI is large if the value of dV/dt when tuning on/off of the MOS transistor is large. On the other hand, if the value of dV/dt is small, it is likely to cause a shoot-through phenomenon. The black arrows are points for measuring the value of dV/dt. Conventionally, it is preferable that the value of dV/dt is below of 3000V/μs. In FIG. 10A, the value of dV/dt is approximately 120V/0.1 μs=1200V/μs. In FIG. 10B, the value of dV/dt is approximately 100V/0.05 μs=2000V/μs. Therefore, in embodiments of the present inverter the thickness of the gate oxide film and the turn-off resistor Rg(off) are selected to improve the EMI noise without shoot-through to dV/dt from FIGS. 10A-B.

As described above, the inverter circuit according to the present invention includes three high voltage drivers and three upper and lower arm transistor pairs driven by the high voltage drivers, and detects currents of three-phase output signals through two or three detection terminals. Therefore, it is possible to prevent a shoot-through phenomenon from occurring by detecting the output currents of a three-phase motor. Furthermore, in the inverter integrated circuit package according to the present invention, leads connected to high voltage driver integrated circuits and transistor integrated circuits are molded with epoxy molding compound to be disposed at different heights, thereby reducing the thickness of the epoxy molding compound and the size of the inverter integrated circuit package. Also, since no heat sink is required, the size of the inverter integrated circuit package can be further reduced.

While the present invention has been described with reference to specific embodiments, it will be understood by those of ordinary skill in the art that various changes in form and details may be made therein without departing from the spirit and scope of the present invention, which is defined by the following claims.

What is claimed is:

1. A motor driving inverter integrated circuit package, comprising:

a lead frame comprising a plurality of chip pads;

a first-phase high voltage driver integrated circuit, a second-phase high voltage driver integrated circuit, and a third-phase high voltage driver integrated circuit, respectively mounted on corresponding chip pads of the plurality of the chip pads;

first-phase upper arm and lower arm transistor integrated circuits, second-phase upper arm and lower arm transistor integrated circuits, and third-phase upper arm and lower arm transistor integrated circuits, respectively mounted on corresponding chip pads of the plurality of the chip pads;

a plurality of first inner leads electrically connected to input terminals of the first-phase, second-phase, and third-phase high voltage driver circuits, respectively;

a plurality of second inner leads electrically connected to input terminals and output terminals of the first-phase, second-phase, and third-phase upper arm and lower arm transistor integrated circuits, respectively;

a plurality of first outer leads connected to the first inner leads;

a plurality of second outer leads connected to the second inner leads;

a plurality of first wires electrically connecting the input terminals of the first-phase, second-phase, and third-phase high voltage driver integrated circuits to the first inner leads, respectively;

a plurality of second wires electrically connecting the output terminals of the first-phase, second-phase, and third-phase high voltage driver integrated circuits to gates of the first-phase, second-phase, and third-phase upper arm and lower arm transistor integrated circuits, respectively;

a plurality of third wires electrically connecting the first-phase, second-phase, and third-phase upper arm transistor integrated circuits to the first-phase, second-phase, and third-phase lower arm transistor integrated circuits, respectively;

a plurality of fourth wires electrically connecting the first-phase, second-phase, and third-phase upper arm and lower arm transistor integrated circuits to the second inner leads, respectively; and a molding material molding the first and second inner leads, the first-phase, second-phase, and third-phase high voltage driver integrated circuits, the first-phase, second-phase, and third-phase upper and lower transistor integrated circuits, and the pluralities of first, second, third, and fourth wires;

wherein the motor driving inverter integrated circuit package is one of a surface mounted device (SMD) or a dual in line package (DIP);

wherein at least one group of the group of the first inner leads and the group of the second inner leads is disposed at a height different from that of the chip pads such that a thickness of the molding material for the integrated circuit package can be reduced.

2. The motor driving inverter integrated circuit package of claim 1, wherein the first outer leads and the second outer leads have essentially the same size and shape.

3. The motor driving inverter integrated circuit package of claim 1, wherein the first-phase, second-phase, and third-phase high voltage driver integrated circuits are arranged in essentially a straight line on the lead frame, and the first-phase, second-phase, and third-phase upper arm and lower arm transistor integrated circuits are respectively arranged parallel to the first-phase, second-phase, and third-phase high voltage driver integrated circuits.

4. The motor driving inverter integrated circuit package of claim 1, wherein a first group of the second inner leads is connected to the first-phase, second-phase, and third-phase upper arm and lower arm transistor integrated circuits by the fourth wires from the first-phase, second-phase, and third-phase upper arm and lower arm transistor integrated circuits; and a second group of the second inner leads is integrated into the first-phase, second-phase, and third-phase upper arm and lower arm transistor integrated circuits, and outer leads connected to the first group of the second inner leads act as sensing terminals for sensing a first-phase current, a second-phase current, and a third-phase current of a motor.

5. The motor driving inverter integrated circuit package of claim 4, wherein among the outer leads connected to the first group of the second inner leads, outer leads acting as the sensing terminals for sensing the first-phase and second-phase currents are connected to each other to act as a common sensing terminal, or are separated from each other to act as separate sensing terminals.

6. A motor driving inverter integrated circuit package, comprising:

a lead frame comprising a plurality of chip pads;

a first-phase high voltage driver integrated circuit, a second-phase high voltage driver integrated circuit, and a third-phase high voltage driver integrated circuit, respectively mounted in a substantially straight line on corresponding chip pads of the plurality of the chip pads;

first-phase upper arm and lower arm transistor integrated circuits, second-phase upper arm and lower arm transistor integrated circuits, and third-phase upper arm and lower arm transistor integrated circuits, respectively arranged in the same direction as that of the first-phase, second-phase, and third-phase high voltage driver integrated circuits, on corresponding chip pads of the plurality of the chip pads;

a group of a plurality of first inner leads and a group of a plurality of second inner leads electrically connected to the first-phase, second-phase, and third-phase high voltage driver integrated circuits and the first-phase, second-phase, and third-phase upper arm and lower arm transistor integrated circuits, respectively;

a group of a plurality of first outer leads connected to the first inner leads;

a group of a plurality of second outer leads connected to the second inner leads;

a plurality of wires electrically connecting the first-phase, second-phase, and third-phase high voltage driver integrated circuits to the first inner leads;

electrically connecting the first-phase, second-phase, and third-phase high voltage driver integrated circuits to the first-phase, second-phase, and third-phase upper arm and lower arm transistor integrated circuits;

electrically connecting the first-phase, second-phase, and third-phase upper arm transistor integrated circuits to the first-phase, the second-phase, and the third-phase lower arm transistor integrated circuits; and electrically connecting the first-phase, second-phase, and third-phase upper arm and lower arm transistor integrated circuits to the plurality of the second inner leads; and a molding material molding the first and second inner leads, the first-phase, second-phase, and third-phase high voltage driver integrated circuits, the first-phase, second-phase, and third-phase upper and lower transistor integrated circuits, and the wires;

wherein the motor driving inverter integrated circuit package is one of a surface mounted device (SMD) or a dual in line package (DIP);

wherein at least one group of the group of the first inner leads and the group of the second inner leads is disposed at a height different from that of the chip pads such that a thickness of the molding material for the integrated circuit package can be reduced.

7. The motor driving inverter integrated circuit package of claim 6, wherein the at least one inner lead, disposed at a height different from the height of the chip pads, is a first inner lead connected to the first-phase, second-phase, and third-phase high voltage driver integrated circuits.

8. The motor driving inverter integrated circuit package of claim 7, wherein the at least one inner lead comprises a curved portion.

9. The motor driving inverter integrated circuit package of claim 6, wherein first chip pads on which the first-phase, second-phase, and third-phase high voltage driver integrated circuits are mounted, among the chip pads of the lead frame, are molded to be disposed higher than second chip pads on which the first-phase, second-phase, and third-phase upper arm and lower arm transistor integrated circuits are mounted.

10. The motor driving inverter integrated circuit package of claim 9, wherein a portion of the molding material, which molds a back surface of the second chip pad opposite to a front surface where the first-phase, second-phase, and third-phase upper arm and lower arm transistor integrated circuits are mounted on the second chip pads, has a thickness between 0.1 and 0.5 mm.

* * * * *